United States Patent
Hoque et al.

(10) Patent No.: US 7,928,765 B2
(45) Date of Patent: Apr. 19, 2011

(54) TUNING HIGH-SIDE AND LOW-SIDE CMOS DATA-PATHS IN CML-TO-CMOS SIGNAL CONVERTER

(75) Inventors: Anamul Hoque, Apple Valley, MN (US); Cameron C. Rabe, Inver Grove Heights, MN (US)

(73) Assignee: LSI Corporation, Milpitas, CA (US)

( * ) Notice: Subject to any disclaimer, the term of this patent is extended or adjusted under 35 U.S.C. 154(b) by 137 days.

(21) Appl. No.: 12/413,723

(22) Filed: Mar. 30, 2009

(65) Prior Publication Data

US 2010/0244899 A1 Sep. 30, 2010

(51) Int. Cl.
*H03K 19/094* (2006.01)
(52) U.S. Cl. ............... 326/66; 326/64; 326/73; 326/77
(58) Field of Classification Search ............ 326/64–66, 326/68, 70, 71, 73, 76, 77, 56–58
See application file for complete search history.

(56) References Cited

U.S. PATENT DOCUMENTS

| | | | | |
|---|---|---|---|---|
| 5,225,717 A * | 7/1993 | Shiomi et al. | | 326/66 |
| 5,428,312 A * | 6/1995 | Higeta et al. | | 327/333 |
| 5,739,703 A * | 4/1998 | Okamura | | 326/110 |
| 6,100,716 A * | 8/2000 | Adham et al. | | 326/68 |
| 6,252,421 B1 * | 6/2001 | Kiriaki | | 326/77 |
| 6,462,852 B1 * | 10/2002 | Paschal et al. | | 398/202 |
| 6,489,811 B2 * | 12/2002 | Jenkins | | 326/115 |
| 6,566,908 B2 * | 5/2003 | Mack | | 326/63 |
| 6,956,400 B2 * | 10/2005 | Ilchmann | | 326/66 |
| 7,038,495 B2 * | 5/2006 | Choi | | 326/127 |
| 7,084,694 B2 * | 8/2006 | Preisach | | 327/433 |
| 7,173,453 B2 * | 2/2007 | Prather et al. | | 326/80 |
| 7,202,706 B1 * | 4/2007 | Plasterer et al. | | 326/127 |
| 7,274,216 B2 * | 9/2007 | Pickering et al. | | 326/63 |
| 7,282,952 B2 * | 10/2007 | Oka | | 326/63 |
| 7,288,971 B1 * | 10/2007 | Plasterer et al. | | 326/127 |
| 7,301,370 B1 * | 11/2007 | Hanna et al. | | 326/68 |
| 7,368,948 B2 * | 5/2008 | Dubey | | 326/81 |
| 7,400,168 B2 * | 7/2008 | Katou | | 326/68 |
| 7,425,844 B1 * | 9/2008 | Chung et al. | | 326/68 |
| 7,429,877 B2 * | 9/2008 | Arsovski et al. | | 326/83 |
| 7,486,112 B2 * | 2/2009 | Tanaka | | 326/83 |
| 7,521,976 B1 * | 4/2009 | Sudjian et al. | | 327/199 |
| 7,642,828 B2 * | 1/2010 | Sakai | | 327/175 |
| 2004/0119498 A1 * | 6/2004 | Ilchmann | | 326/66 |
| 2005/0285623 A1 * | 12/2005 | Jahan et al. | | 326/68 |

(Continued)

*Primary Examiner* — James H. Cho
*Assistant Examiner* — Matthew C. Tabler
(74) *Attorney, Agent, or Firm* — Ryan, Mason & Lewis, LLP

(57) ABSTRACT

Electronic circuitry and techniques are disclosed for controlling one or more timing parameters associated with a circuit that converts a signal of a first type to a signal of a second type. For example, the converter circuit may convert a differential digital logic signal, such as a current mode logic (CML) signal, to a complementary metal oxide semiconductor (CMOS) signal. For example, apparatus for converting a first type of signal to a second type of signal comprises the following circuitry. First circuitry is configured for generating a first pair of CMOS signals in response to a differential digital logic signal, the first pair of CMOS signals comprising a first CMOS signal having a first polarity and a second CMOS signal having a second polarity. Second circuitry is configured for adjusting, with respect to the first pair of CMOS signals, a transition time of one of the first CMOS signal and the second CMOS signal relative to a transition time of another of the first CMOS signal and the second CMOS signal.

20 Claims, 4 Drawing Sheets

U.S. PATENT DOCUMENTS

| | | | |
|---|---|---|---|
| 2006/0061390 A1* | 3/2006 | Tam | 326/105 |
| 2006/0220696 A1* | 10/2006 | Katou | 327/100 |
| 2007/0285147 A1* | 12/2007 | Sakai | 327/333 |
| 2008/0079462 A1* | 4/2008 | Chiu et al. | 326/115 |
| 2009/0091364 A1* | 4/2009 | Aoki | 327/175 |
| 2010/0134145 A1* | 6/2010 | Bernard et al. | 326/68 |

* cited by examiner

FIG. 2

(A)
CML SIGNAL ON BIPOLAR COLLECTOR 128-1 (THIN LINE)

CML SIGNAL ON BIPOLAR COLLECTOR 128-2 (THICK LINE)

DELAYED TURN OFF CASE

SHORTED CMOS COMMON MODE VOLTAGE (DASHED LINE)

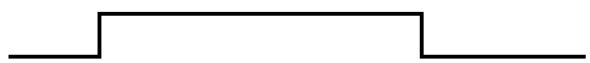

(B)
RESULTING CMOS SIGNAL ON L1

RESULTING CMOS SIGNAL ON L2

(C)
CML SIGNAL ON BIPOLAR COLLECTOR 128-1 (THIN LINE)

CML SIGNAL ON BIPOLAR COLLECTOR 128-2 (THICK LINE)

BALANCED CASE

SHORTED CMOS COMMON MODE VOLTAGE (DASHED LINE)

(D)
RESULTING CMOS SIGNAL ON L1

RESULTING CMOS SIGNAL ON L2

(E)
CML SIGNAL ON BIPOLAR COLLECTOR 128-1 (THIN LINE)

CML SIGNAL ON BIPOLAR COLLECTOR 128-2 (THICK LINE)

DELAYED TURN ON CASE

SHORTED CMOS COMMON MODE VOLTAGE (DASHED LINE)

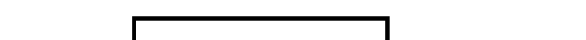

(F)
RESULTING CMOS SIGNAL ON L1

RESULTING CMOS SIGNAL ON L2

US 7,928,765 B2

TUNING HIGH-SIDE AND LOW-SIDE CMOS DATA-PATHS IN CML-TO-CMOS SIGNAL CONVERTER

FIELD OF THE INVENTION

The present invention relates generally to electronic circuitry, and more particularly to electronic circuitry for converting current mode logic (CML) signals to complementary metal oxide semiconductor (CMOS) signals for use, for example, with a write driver of a preamplifier of a hard disk drive system.

BACKGROUND OF THE INVENTION

A hard disk drive is a non-volatile storage device which stores digitally encoded data on one or more rapidly rotating platters with magnetic surfaces, collectively referred to as the disk. CML and CMOS technologies, when used in an integrated circuit such as a preamplifier integrated circuit in a disk drive system, require a conversion of CML differential voltage levels to CMOS compatible voltage levels. CML voltage levels represent the two values of a data bit (to be stored on the disk) typically by alternately setting one of the two voltage levels to be more positive than the other. A typical CML circuit operates with a differential swing of about two to three hundred millivolts (mV), although but smaller and larger swings are possible. Thus, a CML signal is more generally a differential digital logic signal. A typical CMOS circuit operates according to a single ended voltage, with two specified voltage ranges (respectively corresponding to a high-side data-path and a low-side data-path) that represent the two values of the data bit (to be stored on the disk).

With respect to a write driver, i.e., typically the circuit in a preamplifier that is responsible for controlling the data that is to be written on the disk via by the write head, write driver rise time and common mode (CM) are two parameters that can affect density and bit error rate in an integrated circuit design that embodies the write driver. In existing designs, there is always significant discrepancy in rise time and common mode between simulation and empirical data, due at least in part to inaccuracy of large signal simulation. Unfortunately, with existing approaches, a designer is not able to adjust the alignment of the high-side and low-side CMOS signals. Thus, the designer has to live with the alignment of the CMOS signals that is inherent with the silicon used to fabricate the integrated circuit design, even though the signals have been correctly simulated. Alternately, the designer may have to re-spin the parts to fix the alignment, which in turn affects cost and time to market.

SUMMARY OF THE INVENTION

The present invention in one or more illustrative embodiments provides electronic circuitry and techniques for controlling one or more timing parameters associated with a circuit that converts a signal of a first type to a signal of a second type. For example, the converter circuit may convert a differential digital logic signal, such as a current mode logic (CML) signal, to a complementary metal oxide semiconductor (CMOS) signal. While the invention is not intended to be limited thereto, the electronic circuitry and techniques are particularly suitable for use with a write driver of a preamplifier of a hard disk drive system.

For example, in accordance with one embodiment, apparatus for converting a first type of signal to a second type of signal, wherein the first type of signal comprises a differential digital logic signal and the second type of signal comprises a complementary metal oxide semiconductor (CMOS) signal, comprises the following circuitry. First circuitry is configured for generating a first pair of CMOS signals in response to a differential digital logic signal, the first pair of CMOS signals comprising a first CMOS signal having a first polarity and a second CMOS signal having a second polarity. Second circuitry is configured for adjusting, with respect to the first pair of CMOS signals, a transition time of one of the first CMOS signal and the second CMOS signal relative to a transition time of another of the first CMOS signal and the second CMOS signal.

The apparatus may also comprise third circuitry configured for generating a second pair of CMOS signals in response to the differential digital logic signal, the second pair of CMOS signals comprising a first CMOS signal having a first polarity and a second CMOS signal having a second polarity, and fourth circuitry configured for adjusting, with respect to the second pair of CMOS signals, a transition time of one of the first CMOS signal and the second CMOS signal relative to a transition time of another of the first CMOS signal and the second CMOS signal.

Also, the first pair of CMOS signals may be generated for one of a logic high signal path (e.g., high-side data-path) and a logic low signal path (e.g., low-side data-path), and the second pair of CMOS signals generated for another of the logic high signal path and the logic low signal path.

Advantageously, the adjustment of the transition time in the first pair of CMOS signals is independent of the adjustment of the transition time in the second pair of CMOS signals. Also, advantageously, the operating voltage level of the logic high signal path may have the same magnitude as an operating voltage level of the logic low signal path, or it may have a different magnitude than the operating voltage level of the logic low signal path.

These and other objects, features, and advantages of the present invention will become apparent from the following detailed description of illustrative embodiments thereof, which is to be read in connection with the accompanying drawings.

BRIEF DESCRIPTION OF THE DRAWINGS

FIG. 2 illustrates timing associated with the CML and CMOS signals for various cases according to one embodiment of the invention.

DETAILED DESCRIPTION OF THE INVENTION

Embodiments of the invention will be illustrated herein in conjunction with an exemplary CML-to-CMOS converter associated with a write driver of a hard disk drive system. It should be understood, however, that the tuning principles of the present invention can be implemented using other types of circuitry and systems than that specifically shown and described in conjunction with the illustrative embodiments.

As noted above, write driver rise time and output common mode depends on the alignment of high-side and low-side CMOS data-paths. However, the CMOS signal comes out of alignment easily due to minor process skews, e.g., the threshold voltage level (Vt) of NMOS (negative metal oxide semiconductor) and PMOS (positive metal oxide semiconductor) gates in the integrated circuit. This misalignment may occur even though the design is simulated correctly. In accordance with one or more embodiments of the invention, the high-side and low-side CMOS data-paths are able to be re-aligned by programming (controlling) the output common mode of both the high-side and low-side data-paths of a CML-to-CMOS converter. Advantageously, by programming the output common mode of both the high-side and low-side data-paths of the CML-to-CMOS converter, a designer is able to program (control) the skew between high-side and the low-side CMOS signals to compensate for any misalignment. Such re-aligned CMOS signals may then feed a write driver and advantageously generate faster edge rate and low common mode voltage for a higher fidelity preamplifier.

It is to be understood that the following circuit description is given below without reference to the specific terminals (e.g., input and output), gates, sources, drains, etc. by which a given component is coupled to one or more other components. Given the circuit diagram of FIG. 1, the functional description of each component below, and their interaction with one another also described in detail below, one of ordinary skill in the art would realize how each component is to be coupled in order to implement the circuitry of the various embodiments of the invention. Of course, it is also to be understood that the coupling of components could be accomplished in a variety of alternative straightforward ways, each of which could achieve various advantages of the invention.

Figure 1:
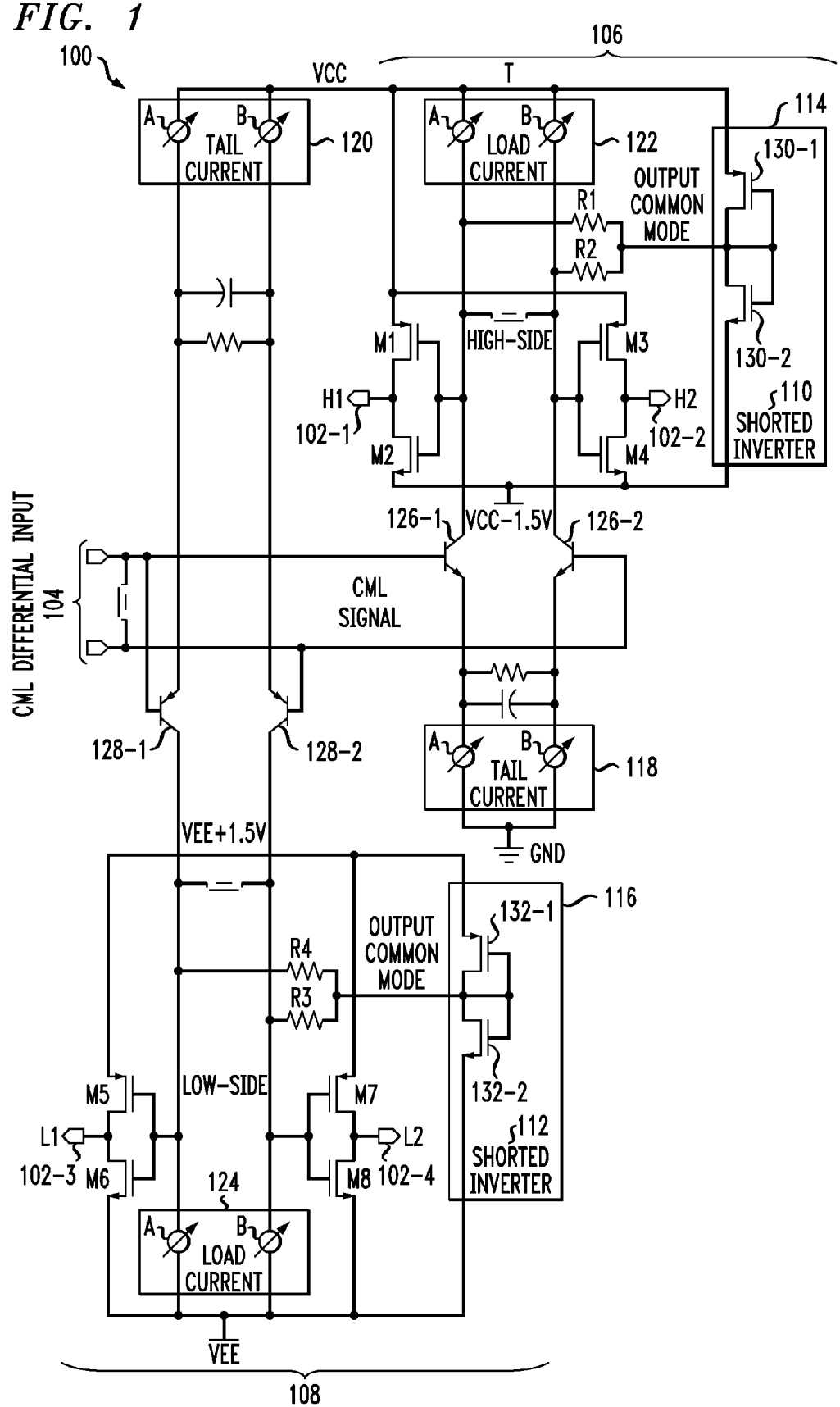
FIG. 1 illustrates a CML-to-CMOS converter circuit according to one embodiment of the invention.

FIG. 1 illustrates a CML-to-CMOS converter circuit according to one embodiment of the invention. The CML-to-CMOS converter circuit (cell) 100 generates four digital (e.g., 1.5V) signals 102-1 (H1 on high-side) 102-2 (H2 on high-side), 102-3 (L1 on low-side) and 102-4 (L2 on low-side) based on a CML differential input signal 104. These signals are positive (H1 and L1) and negative (H2 and L2) polarity. The high-side signals are referenced to a first voltage range set between VCC and VCC−1.5V power sources. The low-side signals are referenced to a second voltage range set between VEE and VEE+1.5V power sources. The four digital signals (H1, H2, L1, and L2) are then buffered before feeding a write driver (illustrated in FIG. 4 and described below).

CML-to-CMOS converter circuit 100 thus includes two main signal paths or data-paths, high-side data-path 106 whose output operates between VCC and VCC−1.5V, and low-side data-path 108 whose output operates between VEE and VEE+1.5V. These paths are replicas of each other with inversions in the NPN/PNP differential pair arrangement. A series of programmable current mirrors (122 in high-side data-path 106 and 124 in the low-side data-path 108) and programmable tail current sources 118 and 120 that include beta current compensation for the NPN and PNP differential pairs in the signal paths adjust the common mode voltage to the four output driver inverters M1/M2 (high-side 106), M3/M4 (high-side 106), M5/M6 (low-side 108) and M7/M8 (low-side 108).

Each signal path is terminated with a pair of differential resistors (R1 and R2 in high-side data-path 106; and R3 and R4 in low-side data-path 108) that are held at the CMOS digital switch point which is approximately at the middle of the rail (VCC and VCC−1.5V, VEE+1.5V and VEE) by a shorted inverter (110 in high-side data-path 106; and 112 in low-side data-path 108) in common mode bias circuits (114 in high-side data-path 106; and 116 in low-side data-path 108). The common mode voltage to the output inverters is now independently programmed by controlling the tail current (118 in high-side data-path 106; and 120 in low-side data-path 108) or the load current (122 in high-side data-path 106; and 124 in low-side data-path 108) to adjust the relative turn-on/turn-off times of both the high-side and low-side CMOS signals to achieve the desired rise time and reduce the common mode component of the writer driver. The magnitude of the difference in the turn-on time and the turn-off time of the H1 and H2 signals on the high-side, and the L1 and L2 signals on the low-side is determined by the rise time of the signal at the bipolar differential pair collectors (described below) and the amount of common mode shift.

The values of R1, R2, R3 and R4 and magnitude of the current sources are largely determined by the maximum toggle frequency of the data. The resistor values and node capacitance determine the settling time of signal voltages at the collectors of transistors 126-1 and 126-2 in the high-side path 106, and at the collectors of transistors 128-1 and 128-2 on the low-side 108. These nodes must be settled to their final value before transitioning back to their starting value to prevent a timing shift. Typical resistor values are about 200 ohms, and typical magnitudes of the current in the programmable sources are about 1 milliamp for 2 gigahertz operation.

Each signal paths includes two programmable load current sources (122-A and 122-B in high-side data-path 106; and 124-A and 124-B in low-side data-path 108) from one voltage rail (VCC in high-side data-path 106; and VEE in low-side data-path 108) driving into a differential pair of transistors (126-1 and 126-2 in high-side data-path 106; and 128-1 and 128-2 in low-side data-path 108) with a programmable tail current sources (118-A and 118-B in high-side data-path 106; and 120-A and 120-B in low-side data-path 108). The tail current sources must be compensated by the amount of base current used by their respective bipolar devices since it is the collector current that is to be controlled.

At this point, the collectors of the differential transistor pairs are high impedance nodes that are free to float to any voltage. The collectors are tied to a pair of differential resistors (R1 and R2 in high-side data-path 106; and R3 and R4 in low-side data-path 108), that are common-mode tied to a shorted inverter (formed by 130-1 and 130-2 in high-side data-path 106; and 132-1 and 132-2 in low-side data-path 108). The differential transistor pairs switch current through the differential load resistors, thus swinging the collector nodes above and below threshold and generate a CMOS signal which will hold over process variation and geometric mismatch.

Advantageously, since the shorted inverters are roughly the same scale as the output inverters (comprised of devices M1 and M2 for H1, M3 and M4 for H2 on the high-side 106, and devices M5 and M6 for L1, and devices M7 and M8 on the low-side 108), the modulation of the threshold voltage due to process variation and power supply bounce is similar.

A summary explanation for further understanding the operation of the conversion circuit 100 is as follows (explained from the perspective of the high-side data-path 106). There are two output inverters made up of M1/M2 and M3/M4, respectively. They switch or transition from low to high or high to low when the input voltage equals their output voltage. The bipolar differential pair, 126-1 and 126-2, steer the current from one side to the other and into or out of R1 and R2 that generates a differential voltage signal to the input of the output inverter pair. The shorted common mode inverter 114 generates a voltage that tracks the output inverters switching point over process and temperature.

When the load currents 122 and tail currents 118 (adjusted for the bipolar beta) are equal, and when the CML signals become equal (the CML switch point), there is no current flowing through R1 and R2. The voltage at the output inverters is equal to the shorted inverter voltage (by definition the switch point) so both output inverters are switching, one transitioning from low to high, and the other from high to low all in sync with each other.

By adjusting the load or tail currents, the common mode level of the signals to the input of the output inverters can be moved higher or lower than the switch point.

Taking advantage of the finite rise time of the signals to the inputs of the output inverters, one can adjust the common mode so that one output inverter reaches its switch point before the other so the high going transition of H1 can be earlier or later than the low going transition of H2 and vice versa.

Note that the low-side data-path 108 is merely a PNP/NPN differential pair inversion, and can have the high going transition on L1 be adjusted earlier or later than the low going transition of L2, and vice versa, and independently of the high-side.

It is also to be appreciated that one could add as many of these conversion modules onto the CML signal as desired, each being independently programmed to its own turn on/turn off time and to whatever voltage levels desired.

It is also to be appreciated that in alternative embodiments, conversion circuit 100 can be used for VEE values of −5V, −3V and 0V (same as ground) while keeping VCC at 5V.

FIG. 2 illustrates the CML signal timing and how shifting the common mode level on the differential pair collectors causes L1 and L2 high-going and low-going transitions to be adjusted. Note that FIG. 2 illustrates timing on the low-side data-path 108, however, it works the same for the high-side data-path 106. One main purpose of the transition time adjustments is to compensate for any process skew that occurs. Timing diagrams (A) and (B) in FIG. 2 illustrates the "delayed turn off" case. More particularly, with reference to components of circuit 100 in FIG. 1, timing diagram (A) shows the CML signal on the collector of bipolar transistor 128-1 (thin line), the CML signal on the collector of bipolar transistor 128-2 (thick line), and shorted CMOS common mode voltage level (dashed line). Timing diagram (B) shows the resulting CMOS signal at L1, and the resulting CMOS signal at L2. Note that the high-going transition of the CMOS signal at L1 occurs before the low-going transition of the CMOS signal at L2. Likewise, the high-going transition of the CMOS signal at L2 occurs before the low-going transition of the CMOS signal at L1.

Timing diagrams (C) and (D) in FIG. 2 illustrates the "balanced" case. More particularly, with reference to components of circuit 100 in FIG. 1, timing diagram (C) shows the CML signal on the collector of bipolar transistor 128-1 (thin line), the CML signal on the collector of bipolar transistor 128-2 (thick line), and shorted CMOS common mode voltage level (dashed line). Timing diagram (D) shows the resulting CMOS signal at L1, and the resulting CMOS signal at L2. Note that the high-going transition of the CMOS signal at L1 occurs substantially at the same time with the low-going transition of the CMOS signal at L2. Likewise, the high-going transition of the CMOS signal at L2 occurs substantially at the same time as the low-going transition of the CMOS signal at L1.

Timing diagrams (E) and (F) in FIG. 2 illustrates the "delayed turn on" case. More particularly, with reference to components of circuit 100 in FIG. 1, timing diagram (E) shows the CML signal on the collector of bipolar transistor 128-1 (thin line), the CML signal on the collector of bipolar transistor 128-2 (thick line), and shorted CMOS common mode voltage level (dashed line). Timing diagram (F) shows the resulting CMOS signal at L1, and the resulting CMOS signal at L2. Note that the high-going transition of the CMOS signal at L1 occurs after the low-going transition of the CMOS signal at L2. Likewise, the high-going transition of the CMOS signal at L2 occurs after the low-going transition of the CMOS signal at L1.

Figure 3:
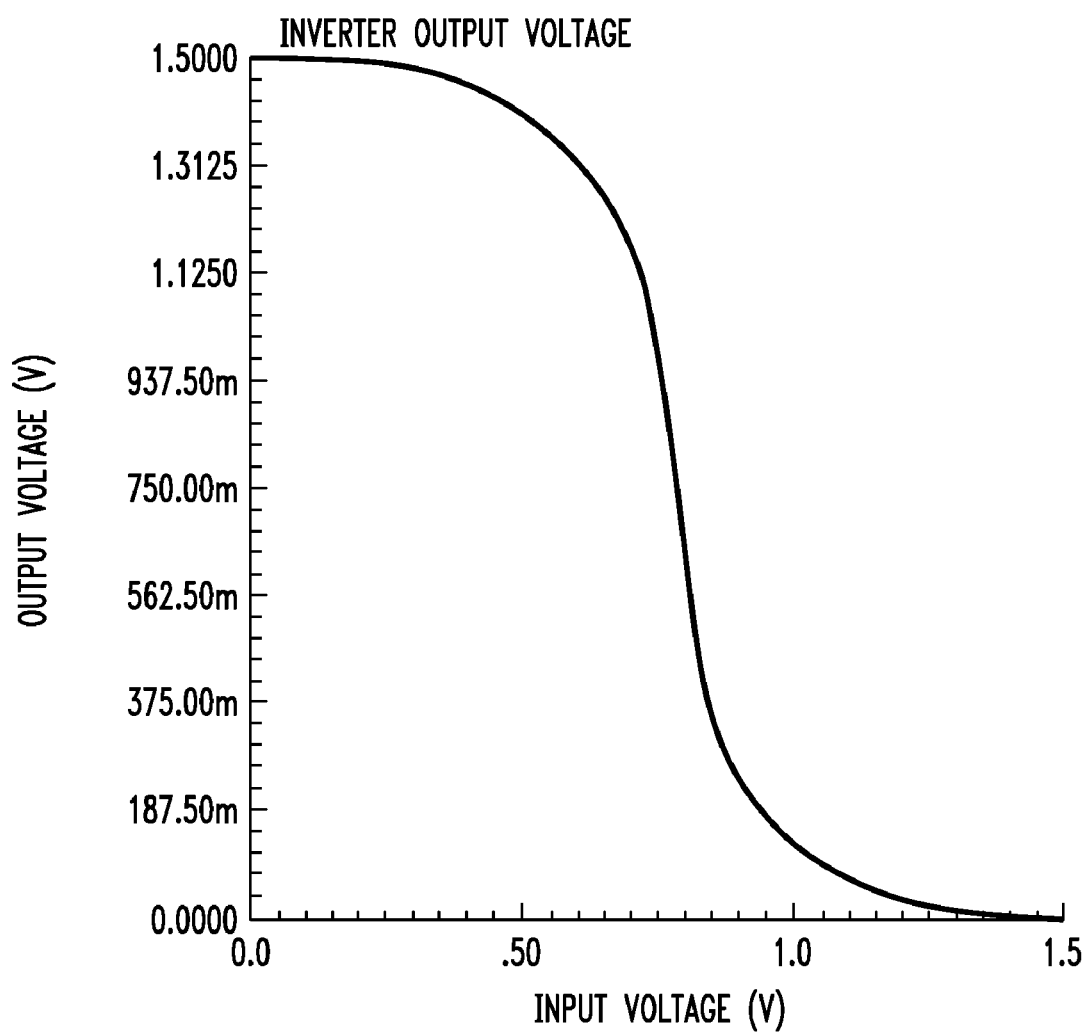
FIG. 3 illustrates input voltage versus output voltage of a CMOS output inverter according to one embodiment of the invention.

FIG. 3 shows input voltage versus output voltage (transfer curve) of a CMOS output inverter. As is evident from the plot, as soon as the input to the gates of the output inverters (M1/M2, M3/M4, M5/M6, and M7/M8) are 100 mV less than or greater than the switch point (point at which the input voltage and output voltage are equal) you get almost full CMOS levels out. When the output inverters are buffered by going into a follow-on inverter, the signals are even closer to full swing.

Figure 4:
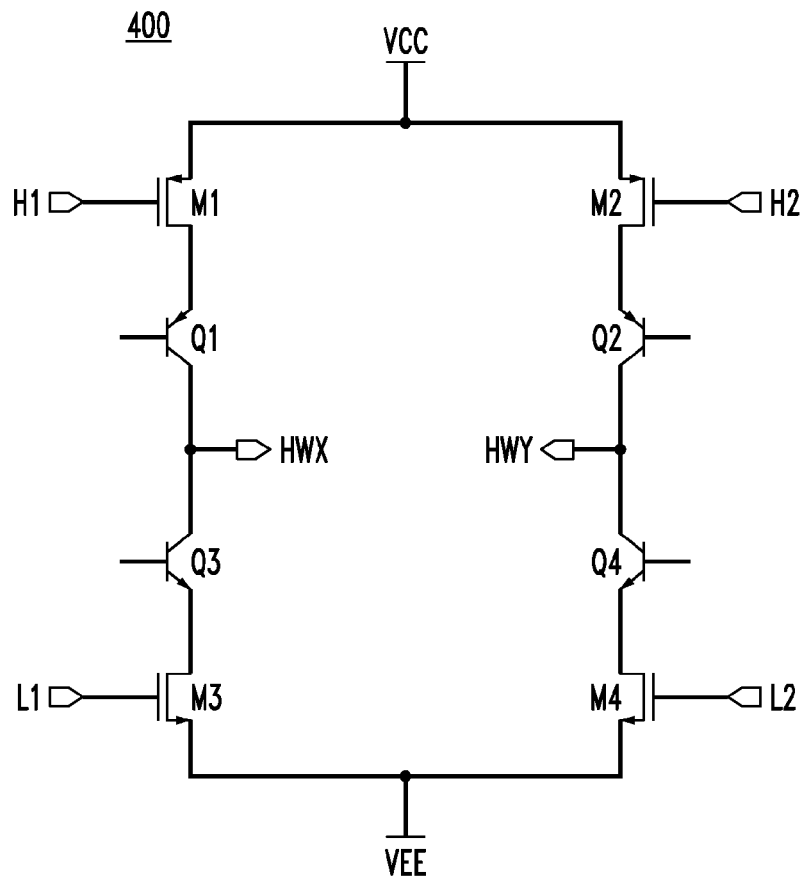
FIG. 4 illustrates an example of a write driver according to one embodiment of the invention.

FIG. 4 shows an example of a write driver 400, which is operatively coupled to the CML-to-CMOS converter 100 (FIG. 1). H1, H2, L1, and L2 (or derivatives thereof, when buffered prior to being provided to write driver 400) from the converter 100 drive the final write driver, which is usually some form of an H bridge. When H1 is a digital high and H2 is a digital low (referenced to VCC) and L1 is a digital high and L2 is a digital low (referenced to VEE), current flows from VCC thru M2, Q2 out pin HWY to the write head and into HWX down Q3 and M3 to VEE. Conversely, when L1 and H1 are low, and L2 and H2 are high, current flows from VCC thru M1, Q1, out pin HWX, thru a write head, into HWY and down Q4, M4 to VEE.

For a balanced system, all four of these signals need to switch at the same time (H1 turns off, H2 turns on, L1 turns on, and L2 turns off). However, a perfectly balanced system is not always attainable for some speeds that are trying to be attained, so the tuning techniques of the invention allow one to vary the turn on/turn off time of H1 and H2 independently from the turn on/turn off of L1 and L2. It could be that the process gives the fastest write head switching time if L1 is turned on coincidentally with turning L2 off, but wants H1 to turn off slightly early, and H2 turning off slightly late. One can accommodate this case by leaving the low-side un-programmed (at the balanced state) while programming just the high-side.

Figure 5:
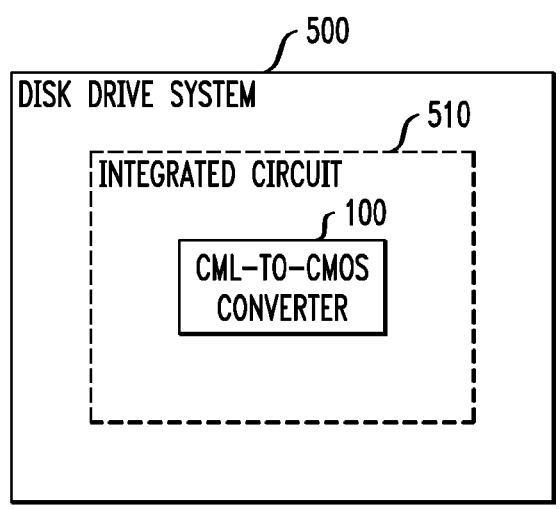
FIG. 5 illustrates an integrated circuit of a disk drive system for implementing a CML-to-CMOS converter circuit according to one embodiment of the invention.

FIG. 5 shows a disk drive system 500 including an integrated circuit 510 that incorporates CML-to-CMOS converter circuitry 100 described in conjunction with FIG. 1. Integrated circuit 510 shown in FIG. 5 may be part of a larger integrated circuit device, such as a microprocessor, central processing unit (CPU), digital signal processor (DSP), application-specific integrated circuit (ASIC), or other type of processor or integrated circuit device. Further, such integrated circuit 510 may be part of a preamplifier integrated circuit with a write driver (not shown) that is mounted near a write head (not shown) of the disk drive system 500.

In an integrated circuit implementation of the invention, multiple integrated circuit dies are typically formed in a repeated pattern on a surface of a wafer. Each such die may include a device comprising write driver and CML-to-CMOS conversion circuitry as described herein, and may include other structures or circuits. Furthermore, in another embodiment, the write driver and CML-to-CMOS conversion circuitry could be implemented in multiple dies and in multiple integrated circuit packages. In any case, the dies are cut or diced from the wafer, then packaged as integrated circuits. One skilled in the art would know how to dice wafers and package dies to produce packaged integrated circuits. Integrated circuits so manufactured are considered part of this invention.

Again, it should be emphasized that the above-described embodiments of the invention are intended to be illustrative only. For example, other embodiments can use different types and arrangements of circuitry, control logic elements, processing elements and other circuit elements for implementing the described functionality. These and numerous other alternative embodiments within the scope of the following claims will be apparent to those skilled in the art.

What is claimed is:

1. Apparatus for converting a first type of signal to a second type of signal, wherein the first type of signal comprises a differential digital logic signal and the second type of signal comprises a complementary metal oxide semiconductor (CMOS) signal, the apparatus comprising:
    first circuitry configured for generating a first pair of CMOS signals in response to a differential digital logic signal, the first pair of CMOS signals comprising a first CMOS signal having a first polarity and a second CMOS signal having a second polarity; and
    second circuitry configured for adjusting, with respect to the first pair of CMOS signals, a transition time of one of the first CMOS signal and the second CMOS signal relative to a transition time of another of the first CMOS signal and the second CMOS signal;
    wherein the first circuity comprises a differential pair of transistors operatively coupled to a pair of output inverters, respectively; and
    wherein the second circuitry comprises:
        a first programmable current source operatively coupled to the pair of output inverters;
        a second programmable current source operatively coupled to the differential pair of transistors;
        a pair of differential resistors operatively coupled to the pair of output inverters, respectively; and
        a shorted common mode inverter operatively coupled to the pair of differential resistors.

2. An integrated circuit comprising the first circuitry and the second circuitry of claim 1.

3. Apparatus for converting a first type of signal to a second type of signal, wherein the first type of signal comprises a differential digital logic signal and the second type of signal comprises a complementary metal oxide semiconductor (CMOS) signal, the apparatus comprising:
    first circuitry configured for generating a first pair of CMOS signals in response to a differential digital logic signal, the first pair of CMOS signals comprising a first CMOS signal having a first polarity and a second CMOS signal having a second polarity;
    second circuitry configured for adjusting, with respect to the first pair of CMOS signals, a transition time of one of the first CMOS signal and the second CMOS signal relative to a transition time of another of the first CMOS signal and the second CMOS signal;
    third circuitry configured for generating a second pair of CMOS signals in response to the differential digital logic signal, the second pair of CMOS signals comprising a first CMOS signal having a first polarity and a second CMOS signal having a second polarity; and
    fourth circuitry configured for adjusting, with respect to the second pair of CMOS signals, a transition time of one of the first CMOS signal and the second CMOS signal relative to a transition time of another of the first CMOS signal and the second CMOS signal.

4. The apparatus of claim 3, wherein the adjustment of the transition time in the first pair of CMOS signals is independent of the adjustment of the transition time in the second pair of CMOS signals.

5. The apparatus of claim 3, wherein the first pair of CMOS signals are generated for one of a logic high signal path and a logic low signal path, and the second pair of CMOS signals are generated for another of the logic high signal path and the logic low signal path.

6. The apparatus of claim 5, wherein the logic high signal path and the logic low signal path are operatively coupled to a write driver of a disk drive system.

7. The apparatus of claim 5, wherein an operating voltage level of the logic high signal path has a same magnitude as an operating voltage level of the logic low signal path.

8. The apparatus of claim 5, wherein an operating voltage level of the logic high signal path has a different magnitude than an operating voltage level of the logic low signal path.

9. The apparatus of claim 3, wherein the differential digital logic signal is a current mode logic (CML) signal.

10. The apparatus of claim 3, wherein the first circuitry comprises a differential pair of bipolar transistors operatively coupled to a pair of CMOS output inverters, respectively.

11. The apparatus of claim 10, wherein the second circuitry comprises:
    a first programmable current source operatively coupled to the pair of CMOS output inverters;
    a second programmable current source operatively coupled to the differential pair of bipolar transistors;
    a pair of differential resistors operatively coupled to the pair of CMOS output inverters, respectively; and
    a shorted common mode inverter operatively coupled to the pair of differential resistors.

12. The apparatus of claim 11, wherein a first of the pair of output inverters transitions from logic high to logic low and a second of the pair of output inverters transitions from a logic low to a logic high, when their respective input voltages are equal to their respective output voltages.

13. The apparatus of claim 12, wherein the differential pair of bipolar transistors controls a flow of current from one of the pair of output inverters to the other of the pair of output inverters and into or out of the pair of differential resistors generating a differential voltage signal to the input of the pair of output inverters.

14. The apparatus of claim 13, wherein the shorted common mode inverter generates a voltage that tracks a switching point of the pair of output inverters over process and temperature.

15. The apparatus of claim 14, wherein, when the first programmable current source and the second programmable current source are equal, and when opposing polarity signals of the differential digital logic signal are equal, current ceases to flow through the pair of differential resistors, and the voltage at the pair of output inverters is equal to the shorted common mode inverter voltage, indicative of a switch point, such that both of the pair of output inverters are switching, one transitioning from low to high, and the other from high to low in sync with each other.

16. The apparatus of claim 15, wherein a common mode level of signals provided to the input of the output inverters is moved one of higher and lower than the switch point by adjusting the first programmable current source and the second programmable current source.

17. The apparatus of claim 16, wherein the common mode level is moved such that one of the pair of output inverters reaches the switch point before the other of the pair of output inverters such that the high going transition of the one output inverter is one of earlier and later than the low going transition of the other output inverter.

18. A method, comprising the steps of:
generating a first pair of complementary metal oxide semiconductor (CMOS) signals in response to a differential digital logic signal, the first pair of CMOS signals comprising a first CMOS signal having a first polarity and a second CMOS signal having a second polarity; and
adjusting, for the first pair of CMOS signals, a transition time of one of the first CMOS signal and the second CMOS signal relative to a transition time of another of the first CMOS signal and the second CMOS signal; and
generating a second pair of CMOS signals in response to the differential digital logic signal, the second pair of CMOS signals comprising a first CMOS signal having a first polarity and a second CMOS signal having a second polarity; and
adjusting, for the second pair of CMOS signals, a transition time of one of the first CMOS signal and the second CMOS signal relative to a transition time of another of the first CMOS signal and the second CMOS signal.

19. The method of claim 18, wherein the adjusting step of the transition time in the first pair of CMOS signals is independent of the adjusting step of the transition time in the second pair of CMOS signals.

20. A disk drive system, comprising:
a differential digital logic signal to complementary metal oxide semiconductor (CMOS) signal conversion circuit, the conversion circuit comprising:
first circuitry configured for generating a first pair of CMOS signals in response to the differential digital logic signal, the first pair of CMOS signals comprising a first CMOS signal having a first polarity and a second CMOS signal having a second polarity;
second circuitry configured for adjusting, with respect to the first pair of CMOS signals, a transition time of one of the first CMOS signal and the second CMOS signal relative to a transition time of another of the first CMOS signal and the second CMOS signal;
third circuitry configured for generating a second pair of CMOS signals in response to the differential digital logic signal, the second pair of CMOS signals comprising a first CMOS signal having a first polarity and a second CMOS signal having a second polarity; and
fourth circuitry configured for adjusting, with respect to the second pair of CMOS signals, a transition time of one of the first CMOS signal and the second CMOS signal relative to a transition time of another of the first CMOS signal and the second CMOS signal; and
a write driver configured for controlling a write head that writes data to at least one disk, the write driver being responsive to the first pair of CMOS signals and the second pair of CMOS signals.

\* \* \* \* \*